United States Patent [19]

Hale

[11] Patent Number: 4,702,342

[45] Date of Patent: Oct. 27, 1987

[54] GOLF CART ENTERTAINMENT SYSTEM

[76] Inventor: Judy Hale, 1500 Diamond Shamrock Tower, Dallas, Tex. 75201

[21] Appl. No.: 815,897

[22] Filed: Jan. 3, 1986

[51] Int. Cl.[4] ............................................. H05K 11/02
[52] U.S. Cl. .............................. 180/333; 280/DIG. 5; 381/86; 455/345
[58] Field of Search ...................... 180/313, 333, 65.1; 280/DIG. 5; 455/344, 345, 346, 347, 351, 354; 334/7, 17, 47, 88; 381/86

[56] References Cited

U.S. PATENT DOCUMENTS

| 2,168,045 | 8/1939 | Pack | 455/345 X |
| 2,875,330 | 2/1959 | Padgett et al. | 455/345 X |
| 3,431,498 | 3/1969 | Varterasian et al. | 455/345 X |
| 3,755,818 | 8/1973 | Greenspan | 455/345 X |

FOREIGN PATENT DOCUMENTS 53-113634 4/1978 Japan ............................ 280/DIG. 5

Primary Examiner—John J. Love
Assistant Examiner—Charles R. Watts
Attorney, Agent, or Firm—Michael A. O'Neil

[57] ABSTRACT

In a golf cart entertainment system, a golf cart is provided with an entertainment source, an amplifier and speakers. Connection means between the speakers and the amplifier are switched through a microswitch on the actuator of the golf cart for activation and deactivation of the speakers. A warning source receives a warning signal from a transmitter and transmits it through the amplifier to the speakers through unswitched connection means.

12 Claims, 2 Drawing Figures

GOLF CART ENTERTAINMENT SYSTEM

BACKGROUND AND SUMMARY OF THE INVENTION

Golfers like to be entertained and keep up with news, particularly sports news and weather news while playing golf. Therefore, golfers often carry radios. However, golf etiquette demands silience when a golfer is lining up a shot and thus the radio must frequently be turned off and on. Therefore, an apparatus is needed for providing golfers with a convenient method of being entertained consistent with golf etiquette.

In accordance with the present invention, a golf cart entertainment system is provided. The entertainment system has an entertainment source and a warning source for providing signals to an amplifier. The amplifier amplifies the signals and transmits the entertainment source signal through switched connection means to speakers. The switched connection means are actuated by operation of the golf cart actuator, typically a foot pedal. When the golf cart foot pedal is operated, a microswitch in the connection means closes and the speakers provide the amplified entertainment source signal to the golfers. When the foot pedal is deactivated, the microswitch is opened and therefore the speakers are no longer producing distracting noise. Thus, the golfers are able to keep up with sports and other news without being required manually turn their radio off and on.

The warning source signal provided to the amplifier is connected through an unswitched connection means to one or both of the speakers. Therefore, even if the golfers are not using the entertainment source, warnings can be transmitted to the golfers and therefore the present invention provides a safety feature. The warning source signal is transmitted from a transmitter on a separate frequency from that frequency, if any, of the entertainment source signal.

Because the entertainment system is switched to the accelerator of the golf cart, when the golf cart is in use, the entertainment system is activated. When the golf cart is stopped, as when the players stop to line up shots or putts, the entertainment system is off and not distracting the golfers. Thus, entertainment is provided to the golfers between strokes and the golfers no longer need to manually turn the radio on and off.

BRIEF DESCRIPTION OF THE DRAWINGS

A more complete understanding of the invention can be had by reference to the following Detailed Description when taken in conjunction with the accompanying Drawings, wherein.

DETAILED DESCRIPTION OF THE INVENTION

Figure 1:
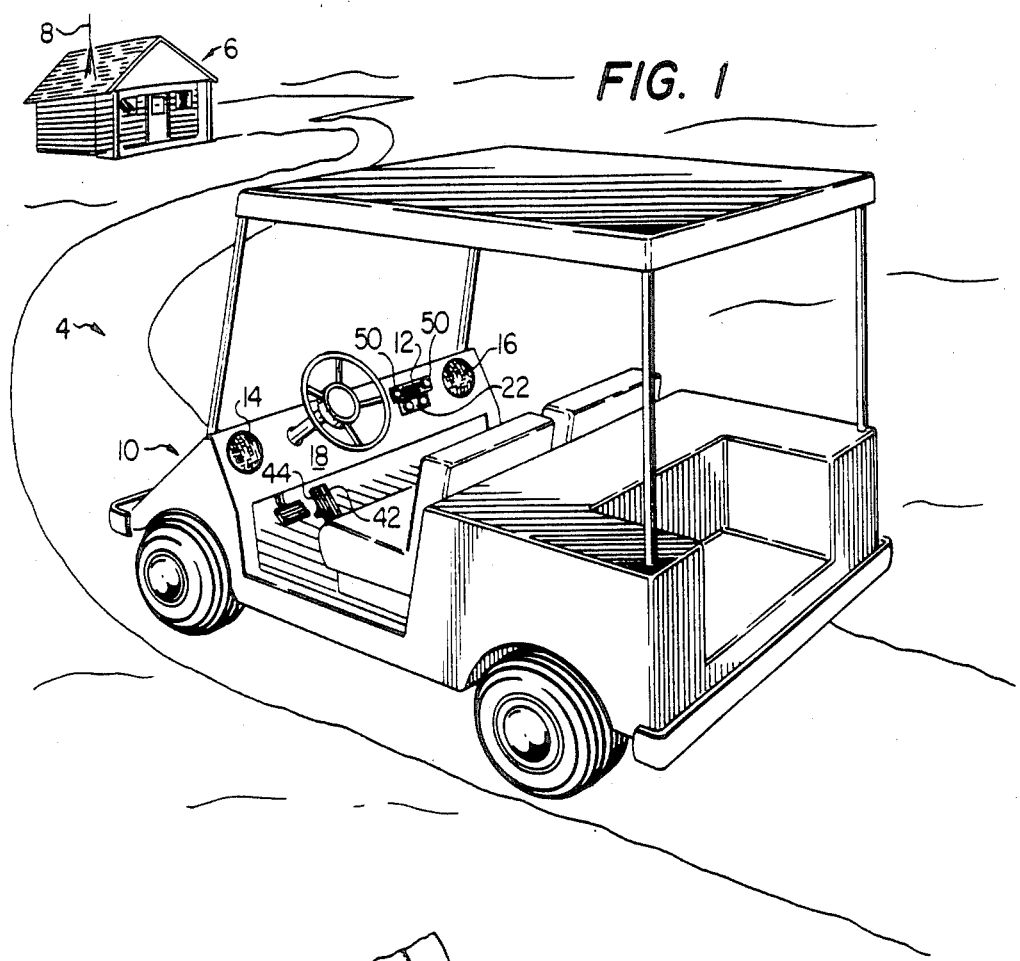
FIG. 1 is an illustration of a golf cart entertainment system incorporating the present invention.

Referring now to the drawings and specifically to FIG. 1 there is shown a golf cart entertainment system 4 incorporating the present invention. A transmitter 8 for transmitting a signal is mounted on a clubhouse 6. A golf cart 10 is provided with an entertainment source 12 and speakers 14 and 16 are mounted on the dash 18 of the golf cart 10. The entertainment source 12 may comprise, for example, a radio, cassette tape deck, compact disk player, television or a combination of such devices. Knobs 50 are provided to turn the entertainment souece 12 on or off and to tune the entertainment source 12. Speakers 14 and 16 are typical speakers known in the art. A warning source 22 is also mounted in the dash 18 of the golf cart 10. The golf cart 10 is activated and deactivated by a foot pedal 42, on the bottom of which is mounted a microswitch 44.

The warning source 22 may comprise a receiver to receive warning broadcasts from the clubhouse transmitter 8. The entertainment source 12 may also comprise a receiver to receive broadcasts from the transmitter 8.

Figure 2:
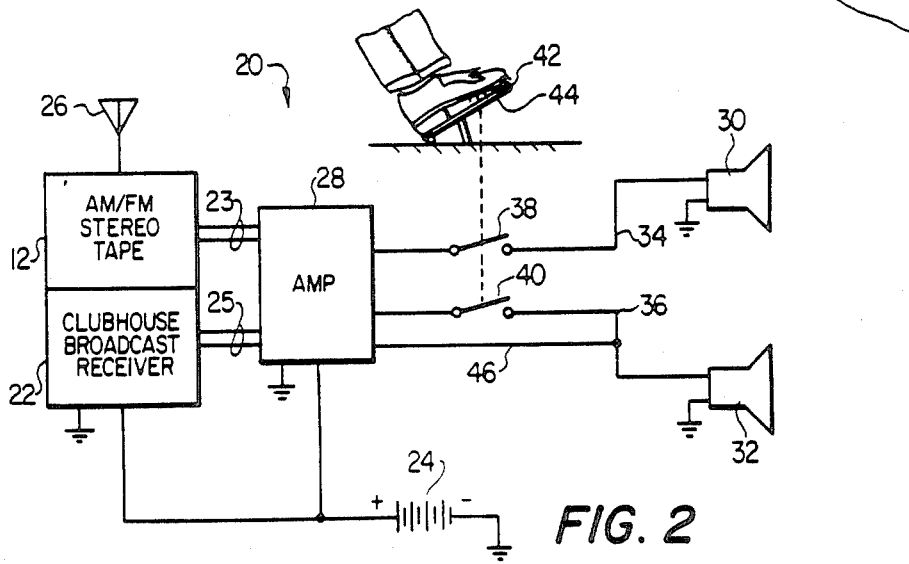
FIG. 2 is a diagram of the circuitry of the system of FIG. 1.

FIG. 2 shows the basic circuitry 20 of a preferred embodiment of the present invention. The circuitry 20 includes the entertainment source 12 and the warning source 22. The entertainment source 12 and warning source 22 receive power frm a battery 24 and are grounded through a ground 26. First connection 23 supply the signal from the entertainment source 12 to an amplifier 28 for amplification. Second connections 25 supply the signal from the warning source 22 to the amplifier 28. The amplifier 28 is also powered by the battery 24. The entertainment output from the amplifier 28 is provided to speakers 30 and 32 through speaker wires 34 and 36. The speaker wires 34 and 36 contain switches 38 and 40 that are activated by the microswitch 44 on the foot pedal 42 of the golf cart 10. The warning output from the amplifier 28 is provided to speaker 32 through an emergency connection 46.

In operation, the foot pedal 42 is depressed to activate the golf cart 10. The microswitch 44 closes the switches 38 and 40 in the speaker wires 34 and 36 and the entertainment output from the amplifier is supplied to the speakers 30 and 32. When the foot pedal 42 is released, the switches 38 and 40 open and the speakers 30 and 32 are no longer activated. Thus, when the golf cart is in use, the entertainment system is operational and golfers can hear the audio supplied from the amplifier. When the golf cart is not in use, the speakers are not activated and there is no distracting noise. Because the switches 38 and 40 are in the speaker wires 34 and 36, if the entertainment source 12 comprises a television, the visual display may be left activated even when the microswitch is open. Therefore, a golfer lining up a shot is not distracted by the audio but a golfer riding in the cart may still watch the television.

The wiring of the emergency connection 46 permits broadcast of an immediate, uninterrupted warning from the clubhouse to the golfers should, for instance, a weather problem arise. The clubhouse transmitter 8 transmits emergency warnings on a separate frequency. The warning source 22 receives the emergency frequency signal and transmits it to the amplifier 28. The warning signal is then amplified and supplied to the speaker 32 through the unswitched emergency connection 46.

The entertainment source 12 may also comprise a receiver for receiving entertainment broadcasts from the clubhouse. In that case, the transmitter 8 transmits an entertainment signal from the clubhouse and the entertainment source 12 receives that signal, amplifies it and provides the signal to the speakers 30 and 32.

The amplifier 28 may be designed to have a maximum volume so that golfers are not distracted because of abuse of the entertainment system by an inconsiderate golfer. Should golfers not want to listen to the entertainment source 12, it can be turned off in the usual manner by using the knobs 50 mounted thereon. Because of the circuitry, even though the entertainment source 12 is turned off the warning source 22 can still be activated by a warning broadcast on the emergency frequency and so the clubhouse is ablve to warn the golfers of any impending dangers. Thus, the present invention provides a safety feature to the golf cart 10.

While the invention has been shown in only one of its forms, it will be apprent to those skilled in the art that it is not so limited, but is susceptible to various changes and modifications without departing from the spirit thereof.

What is claimed is:

1. In combination with a golf cart having a foot pedal for activating and deactivating the golf cart, an entertainment system comprising:
    an entertainment source mounted in the golf cart for providing a signal;
    an amplifier mounted in the golf cart connected to the entertainment source to receive the signal therefrom;
    at least one speaker;
    a switched connection means between said amplifier and said at least one speaker for providing the amplified signal to the speaker; and
    on/off switch means for connecting said switched connection means in response to activating the golf cart by pressing on said foot pedal, to thereby supply the amplified signal to the at least one speaker, and for disconnecting said switched connection means in response to deactivating the golf cart by releasing said foot pedal, to thereby stop said amplified signal from being supplied to the at least one speaker.

2. The entertainment system of claim 1 wherein the entertainment source comprises an AM/FM stereo cassette deck connected to supply a signal to said amplifier and at least two speakers each connected to said connection means for providing a stereo entertainment system to the golf cart and wherein the amplified signal is supplied to said at least two speakers through the on/off switch.

3. The entertainment system of claim 1 further comprising:
    a warning source connected to the amplifier to supply a warning signal to the amplifier; and
    an unswitched connection means for supplying the warning signal from the amplifier to said at least one speaker.

4. The entertainment system of claim 1 further comprising a television and wherein the amplifier is connected to the television to receive the audio signal therefrom.

5. In combination with a golf cart having a foot pedal for activating and deactivating the golf cart, an entertainment system comprising:
    a transmitter for broadcasting a signal;
    a receiver mounted in the golf cart for receiving the broadcast signal;
    an amplifier mounted in the golf cart connected to the receiver to receive the broadcast signal therefrom and produce an amplified signal;
    at least one speaker;
    a switched connection means between said amplifier and said at least one speaker for providing the amplfied signal to the speaker; and
    on/off switch means for connecting said switched connection means in response to activating the golf cart by pressing on said foot pedal, to thereby supply the amplified signal to the at least one speaker, and for disconnecting said switched connection means in response to deactivating the golf cart by releasing said foot pedal, to thereby stop said amplified signal from being supplied to the at least one speaker.

6. The entertainment system of claim 5 wherein the receiver comprises an AM/FM stereo cassette deck connected to supply a signal to said amplifier and at least two speakers each connected to said connection means for providing a stereo entertainment system to the golf cart and wherein the amplified signal is supplied to said at least two speakers through the on/off switch.

7. The entertainment system of claim 5 further comprising:
    an emergency broadcast receiver connected to the amplifier to receive a warning signal and supply that warning signal to the amplifier; and
    an unswitched connection means for supplying the warning signal from the amplifier to the speaker.

8. The entertainment system of claim 5 wherein the receiver comprises a television.

9. In combination with a golf cart having a foot pedal for activating and deactivating the golf cart, an entertainment and warning system comprising:
    an entertainment source for providing an entertainment signal;
    a transmitter for broadcasting a warning signal;
    a warning source mounted in the golf cart for receiving the warning signal;
    an amplifier mounted in the golf cart connected to the entertainment source to receive the broadvcast signal therefrom and connected to the warning source to receive the warning signal therefrom and produce an amplified signal;
    at least one speaker;
    an unswitched first connection means between said amplifier and said at least one speaker for providing the amplified warning signal to said at least one speaker;
    a switched second connection means between said amplifier and said at least one speaker for providing the amplified broadcast signal to said at least one speaker; and
    on/off switch means for connecting said switched second connection means in response to activating the golf supply the amplified signal to the at least one speaker, and for disconnecting said switched second connection means in response to deactivating the golf cart by releasing said amplified signal from being supplied to the at least one speaker.

10. The entertainment system of claim 9 wherein the entertainment source comprises an AM/FM stereo cassette deck connected to supply a signal to said amplifier and at least two speakers each connected to said connection means for providing a stereo entertainment system to the golf cart and wherein the amplified signal is supplied to said at least two speakers through the on/off switch.

11. The entertainment system of claim 9 further comprising a television for receiving a television broadcast and providing an audio broadcast signal and a video display and wherein the amplifier is connected to receive the audio broadcast signal from the television and transmit the amplified audio broadcast signal to the switched second connection means and wherein the amplified signal must pass through the on/off switch to reach the speaker.

12. The entertainment system of claim 9 wherein the transmitter broadcasts the entertainment signal.

* * * * *